(12) United States Patent
Chen et al.

(10) Patent No.: US 11,775,034 B2
(45) Date of Patent: Oct. 3, 2023

(54) HEAT DISSIPATION SYSTEM OF PORTABLE ELECTRONIC DEVICE

(71) Applicant: Acer Incorporated, New Taipei (TW)

(72) Inventors: Tsung-Ting Chen, New Taipei (TW); Wen-Neng Liao, New Taipei (TW); Cheng-Wen Hsieh, New Taipei (TW); Yu-Ming Lin, New Taipei (TW); Wei-Chin Chen, New Taipei (TW); Kuang-Hua Lin, New Taipei (TW); Chun-Chieh Wang, New Taipei (TW); Shu-Hao Kuo, New Taipei (TW)

(73) Assignee: Acer Incorporated, New Taipei (TW)

( * ) Notice: Subject to any disclaimer, the term of this patent is extended or adjusted under 35 U.S.C. 154(b) by 0 days.

(21) Appl. No.: 17/572,634

(22) Filed: Jan. 11, 2022

(65) Prior Publication Data

US 2022/0229477 A1 Jul. 21, 2022

(30) Foreign Application Priority Data

Jan. 15, 2021 (TW) ................................ 110101547

(51) Int. Cl.
*G06F 1/20* (2006.01)
*H05K 7/20* (2006.01)

(52) U.S. Cl.
CPC ......... *G06F 1/203* (2013.01); *H05K 7/20145* (2013.01); *H05K 7/20163* (2013.01)

(58) Field of Classification Search
CPC . H01L 23/34; H01L 23/36; H01L 2023/4087; H01L 2023/4081; H01L 2224/02379; H01L 23/40; G06F 1/20; G06F 1/203; G06F 1/206; G06F 1/181; G06F 1/16; F28D 1/024; F28D 2021/0028; H05K 7/20172; H05K 7/20154; H05K 7/20145; H05K 7/20409; H05K 7/20136; H05K 7/20736; H05K 7/20809; H05K 7/20727; H05K 7/20836; H05K 7/20209; H05K 7/20; H05K 1/0203; H05K 7/20163;
(Continued)

(56) References Cited

U.S. PATENT DOCUMENTS

| 6,847,524 | B2 * | 1/2005 | Tomioka | H05K 7/20154 257/722 |
| 7,649,736 | B2 * | 1/2010 | Hongo | G06F 1/203 361/679.48 |
| 10,423,200 | B1 * | 9/2019 | North | G06F 1/1616 |

(Continued)

FOREIGN PATENT DOCUMENTS

| TW | I402666 | 7/2013 |
| TW | I465184 | 12/2014 |

(Continued)

*Primary Examiner* — Michael A Matey
(74) *Attorney, Agent, or Firm* — JCIPRNET

(57) ABSTRACT

A heat dissipation system of a portable electronic device is provided. The heat dissipation system includes a body and at least one fan. A heat source of the portable electronic device is disposed in the body. The fan is a centrifugal fan disposed in the body. The fan has at least one flow inlet, at least one flow outlet, and at least one spacing portion. The flow outlet faces toward the heat source, and the spacing portion surrounds the flow inlet and abuts against the body, so as to isolate the flow inlet and the heat source in two spaces independent of each other in the body.

11 Claims, 10 Drawing Sheets

(58) Field of Classification Search
CPC ........... H05K 7/20909; H05K 7/20972; H05K 1/0201; F24F 1/0022
See application file for complete search history.

(56) References Cited

U.S. PATENT DOCUMENTS

| | | | | |
|---|---|---|---|---|
| 2002/0067595 | A1* | 6/2002 | Ogawa | G06F 1/20 361/679.48 |
| 2004/0105233 | A1* | 6/2004 | Lai | H05K 7/202 361/695 |
| 2006/0232934 | A1* | 10/2006 | Kusamoto | G06F 1/203 361/679.47 |
| 2010/0220445 | A1* | 9/2010 | Fujiwara | F04D 25/068 415/203 |
| 2011/0157824 | A1* | 6/2011 | Fujiwara | F04D 13/12 415/206 |
| 2011/0310557 | A1* | 12/2011 | Ooe | G06F 1/20 361/692 |
| 2012/0057301 | A1* | 3/2012 | Tan | H05K 7/20809 165/104.26 |
| 2012/0106082 | A1* | 5/2012 | Wu | G06F 1/203 361/695 |
| 2012/0194995 | A1* | 8/2012 | Wang | G06F 1/203 361/679.47 |
| 2012/0229978 | A1* | 9/2012 | Hata | H05K 7/20972 361/695 |
| 2013/0141869 | A1* | 6/2013 | Lin | G06F 1/20 361/697 |
| 2013/0250515 | A1* | 9/2013 | Wu | H05K 7/20154 361/692 |
| 2014/0192468 | A1* | 7/2014 | Kotaka | G06F 1/1616 361/679.55 |
| 2015/0084490 | A1* | 3/2015 | Fujiwara | G06F 1/203 312/236 |
| 2016/0165751 | A1* | 6/2016 | Varadarajan | G06F 1/20 165/80.2 |
| 2020/0081505 | A1* | 3/2020 | Ma | G06F 1/203 |
| 2020/0146178 | A1* | 5/2020 | Horng | H05K 5/0213 |
| 2020/0340493 | A1* | 10/2020 | He | G06F 1/203 |
| 2021/0072805 | A1* | 3/2021 | He | H05K 7/20145 |
| 2021/0219457 | A1* | 7/2021 | Wong | H05K 7/20145 |

FOREIGN PATENT DOCUMENTS

| | | |
|---|---|---|
| TW | I488031 | 6/2015 |
| WO | 2014103371 | 7/2014 |

* cited by examiner

HEAT DISSIPATION SYSTEM OF PORTABLE ELECTRONIC DEVICE

CROSS-REFERENCE TO RELATED APPLICATION

This application claims the priority benefit of Taiwan application serial no. 110101547, filed on Jan. 15, 2021. The entirety of the above-mentioned patent application is hereby incorporated by reference herein and made a part of this specification.

BACKGROUND

Technical Field

The disclosure relates to a heat dissipation system, and more particularly to a heat dissipation system of a portable electronic device.

Description of Related Art

With the rapid development of the current electronics industry, the performance of electronic components continues to improve, and as the computing speed increases, the heat generated also increases. Therefore, a portable electronic device, such as a notebook computer, needs to discharge the air in the portable electronic device with a centrifugal fan, so as to reduce the internal temperature of the device.

Furthermore, in order to comply with the current trend toward compact, lightweight, and highly efficient devices, heat dissipation components in portable electronic devices also need to be miniaturized, and thus the situation where the heat dissipation efficiency is insufficient often occurs.

At the same time, existing fans often have only one flow outlet, and the heat dissipation efficiency thereof is limited. On the premise of not increasing the number of fans, the fan may be designed with two flow outlets, but in the situation where no correspondingly designed airflow path is provided, the fan not only fails to exert the heat dissipation capacity, but also tends to generate a heat dissipation path conflict in the device, or cause an excessive thermal resistance in the device, and thereby causes the situation where the heat accumulation fails to dissipate out of the portable electronic device. For example, if there is no corresponding heat dissipation airflow path, the heat intended to be discharged from the device may be sucked into the device by the fan again.

Based on the above, how to configure the fan in the device and match the specific airflow path to smoothly discharge heat and achieve the required heat dissipation effect is actually a problem that persons skilled in the art should think about and solve.

SUMMARY

The disclosure provides a heat dissipation system of a portable electronic device, which isolates a heat source and a flow inlet of a fan in two independent spaces in a body by using a spacing portion of the fan, so as to ensure that heat dissipation airflow paths generated by the fan do not generate a conflict.

The heat dissipation system of the portable electronic device of the disclosure includes a body and at least one fan. A heat source is disposed in the body. The fan is a centrifugal fan disposed in the body. The fan has at least one flow inlet, at least one flow outlet, and at least one spacing portion. The flow outlet faces toward the heat source, and the spacing portion surrounds the flow inlet and abuts against the body, so as to isolate the flow inlet and the heat source in two spaces independent of each other in the body.

Based on the above, since the heat dissipation system of the portable electronic device makes the spacing portion of the centrifugal fan surround the flow inlet of the fan and abut against the body, so that the flow inlet and the heat source in the body can be isolated in the two spaces independent of each other, the flow inlet can ensure that air sucked in only comes from an external environment of the body, and avoid a possibility that the heat generated by the heat source is sucked in by the fan again, so as to provide an improved approach to an existing heat accumulation situation generated by the heat dissipation path conflict in the body.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
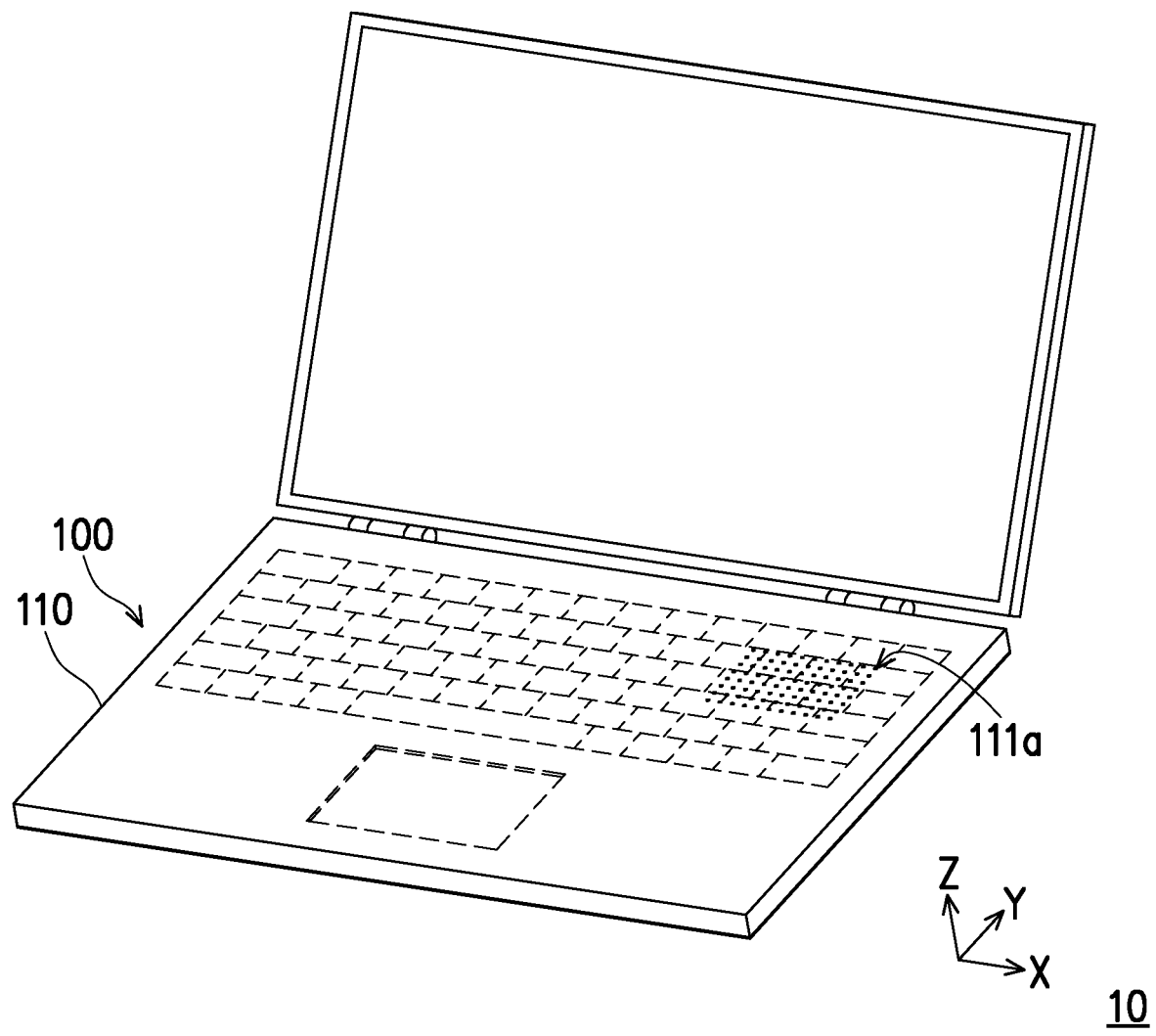
FIG. 1 is a schematic view of a portable electronic device according to an embodiment of the disclosure.

Reference will now be made in detail to the exemplary embodiments of the disclosure, examples of which are illustrated in the accompanying drawings. Wherever possible, the same reference numbers are used in the drawings and the description to refer to the same or like parts.

Figure 2:
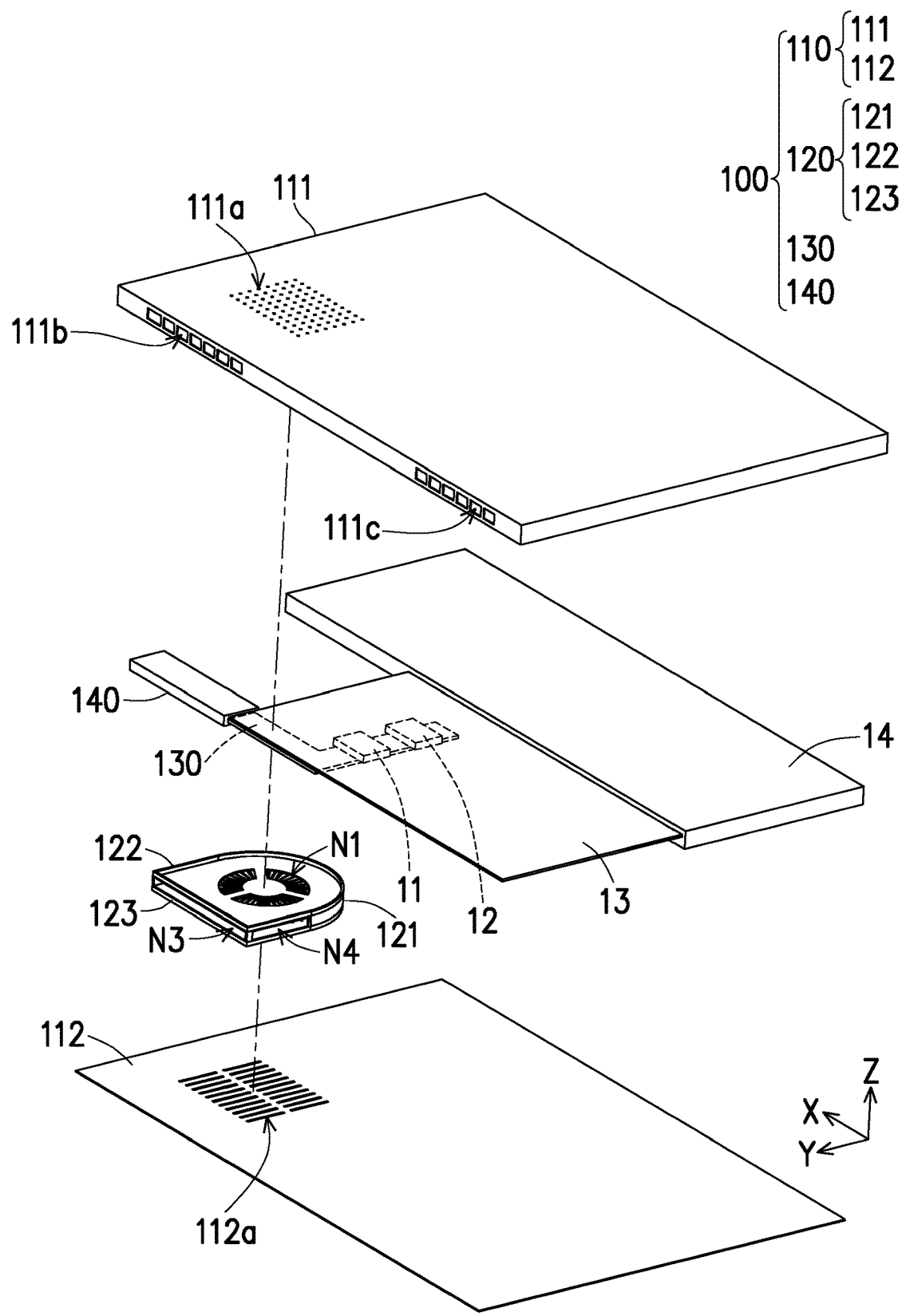
FIG. 2 is an exploded view of a heat dissipation system according to an embodiment of the disclosure.
Figure 3:
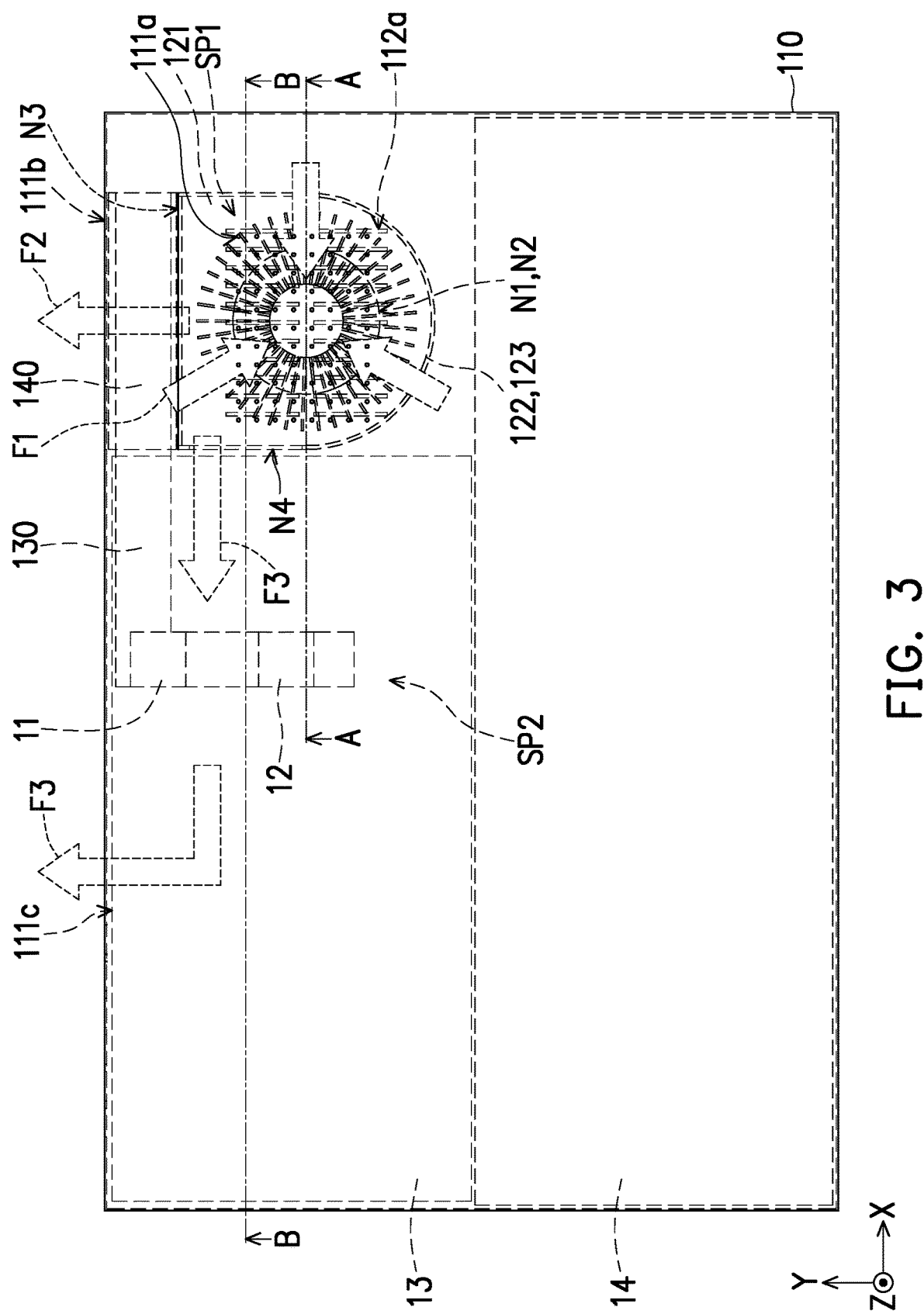
FIG. 3 is a top view of the heat dissipation system according to the disclosure.

FIG. 1 is a schematic view of a portable electronic device according to an embodiment of the disclosure. FIG. 2 is an exploded view of a heat dissipation system according to an embodiment of the disclosure. FIG. 3 is a top view of the heat dissipation system according to the disclosure. The embodiment also provides a Cartesian coordinate system X-Y-Z to facilitate component identification. Referring to all FIG. 1 to FIG. 3, in the embodiment, a heat dissipation system 100 is adapted for a portable electronic device 10 (e.g., a notebook computer), and the heat dissipation system 100 includes a body 110 and at least one fan 120. Heat sources 11 and 12 (e.g., CPU and GPU) are disposed in the body 110. The fan 120 is a centrifugal fan disposed in the body 110. The fan 120 has at least one flow inlet (according to what FIG. 1 to FIG. 3 currently show, the fan 120 has a flow inlet N1, but on an opposite side thereof, there is another flow inlet N2, which is disclosed in a following figure), at least one flow outlet (according to what FIG. 1 to FIG. 3 currently show, the fan 120 has a second flow outlet N3 and a first flow outlet N4), and at least one spacing portion (according to what FIG. 1 to FIG. 3 currently show, the fan 120 has spacing portions 122 and 123 disposed on two opposite surfaces of a fan body 121). The first flow outlet N4 faces toward the heat sources 11 and 12, and the spacing portions 122 and 123 surround the corresponding flow inlets N1 and N2 and respectively abut against the body 110, so as to isolate the flow inlets N1 and N2 and the heat sources 11 and 12 in two spaces independent of each other in the body 110.

Figure 4A:
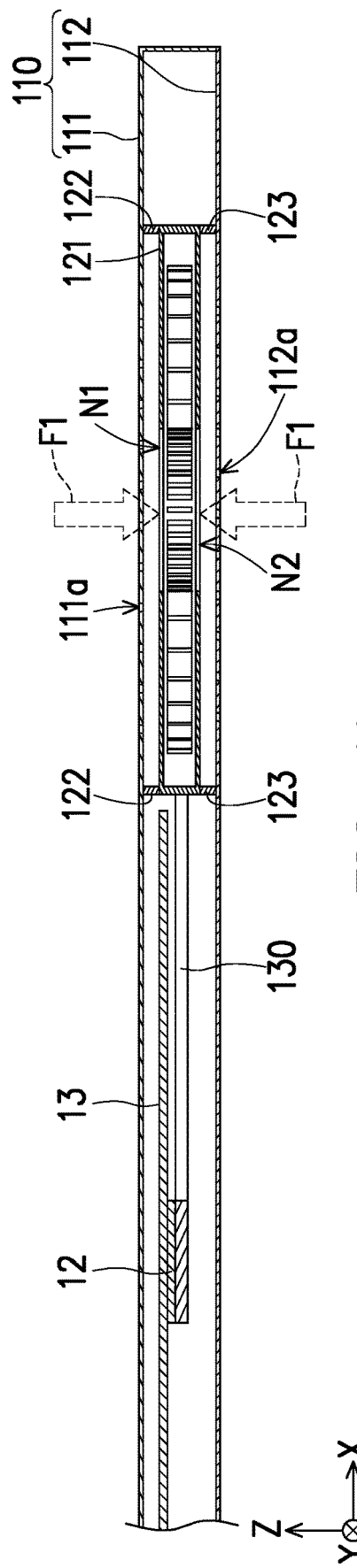
FIG. 4A and FIG. 4B respectively are cross-sectional views of different portions of the heat dissipation system of FIG. 3.
Figure 4B:
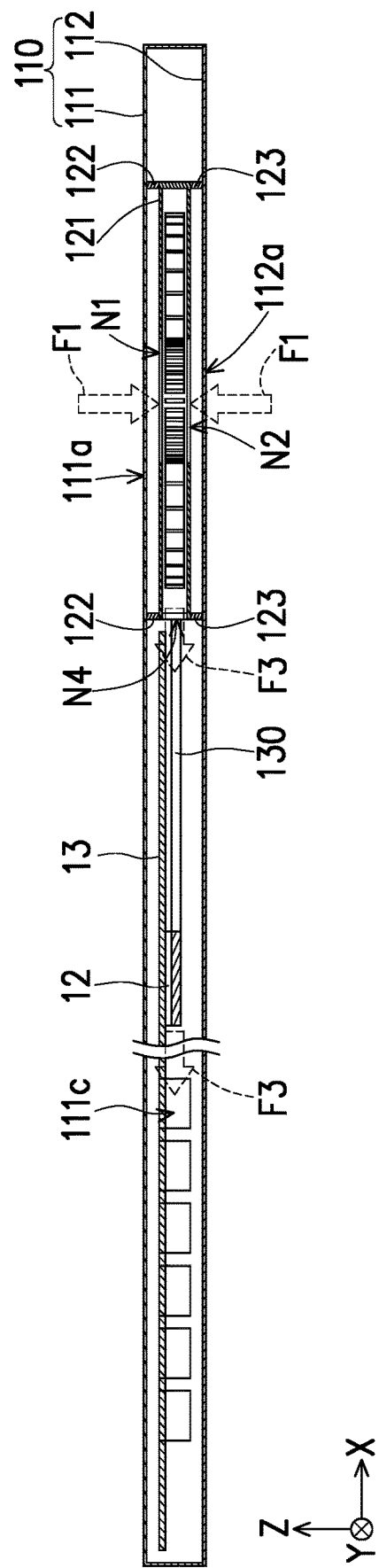

FIG. 4A and FIG. 4B respectively are cross-sectional views of different portions of the heat dissipation system of FIG. 3. Referring to FIG. 2 to FIG. 4A first, the body 110 includes an upper casing 111 and a lower casing 112. At least one of the upper casing 111 and the lower casing 112 has an opening corresponding to the flow inlet, and in the embodiment, the upper casing 111 has an (hole-shaped) opening 111a corresponding to the flow inlet N1 of the fan, and the lower casing 112 has an (grid-shaped) opening 112a corresponding to the flow inlet N2. Accordingly, air in an external environment of the body 110 can flow into the fan 120 through the openings 111a and 112a and the flow inlets N1 and N2. In addition, because the spacing portions 122 and 123 of the fan 120 respectively are buffer materials, such as foam, which have flexibility and elasticity to abut against the upper casing 111 and the lower casing 112, a space in the body 110 where the flow inlets N1 and N2 are located and a space in the body 110 where the heat sources 11 and 12 are located are isolated from and independent of each other, which ensures that the heat generated by the heat sources 11 and 12 does not affect the space where the flow inlets N1 and N2 are located. That is, the flow inlets N1 and N2 can only suck in the air from the external environment through the openings 111a and 112a of the body 110, which ensures that the air sucked in by the fan 120 is cold air, and helps the cold air perform an effective heat dissipation operation on the heat sources 11 and 12 when blowing out from the second flow outlet N3 and the first flow outlet N4. Here, the flow inlets N1 and N2 of the fan 120 are coaxially disposed, and as shown in FIG. 2, the spacing portions 122 and 123 are respectively disposed along a periphery of a structure of the fan body 121 of the fan 120 and form a closed contour.

Referring to FIG. 3, FIG. 4A, and FIG. 4B, in general, the body 110 of the embodiment has at least one opening, and an airflow generated by the fan 120 flows out from the flow outlet, and dissipates heat from the heat sources 11 and 12 or related heat dissipation components, and then flows out of the body 110 from the opening. In detail, the fan 120 of the embodiment operates to suck in the cold air of the external environment of the body 110 from the flow inlets N1 and N2, which is an airflow F1 as shown in the figure. Furthermore, as shown in FIG. 2, FIG. 3, and FIG. 4B, the body 110 has a plurality of openings 111b and 111c, and the heat dissipation system 100 of the portable electronic device 10 further has a heat conducting component 130 and a heat dissipating component 140. As shown in FIG. 2 and FIG. 3, the heat conducting component 130 is, for example, a heat pipe, and the heat dissipating component 140 is, for example, a heat dissipation fin (the figure of the embodiment is only a simple illustration). The heat conducting component 130 is in thermal contact between the heat sources 11 and 12 and the heat dissipating component 140, so as to transfer the heat generated by the heat sources 11 and 12 to the heat dissipating component 140. Moreover, since the fan 120 has the first flow outlet N4 and the second flow outlet N3, air flows F2 and F3 generated by the fan 120 respectively flow out from the first flow outlet N4 and the second flow outlet N3. The heat dissipating component 140 is located between the second flow outlet N3 and the opening 111b. The airflow F2 flowing out from the second flow outlet N3 passes through the heat dissipating component 140 and flows out of the body 110 from the opening 111b, and the airflow F3 flowing out from the first flow outlet N4 passes through the heat sources 11 and 12 and then flows out of the body 110 from the opening 111c.

In this way, the cold air sucked into the fan 120 may respectively flow out from the first flow outlet N4 and the second flow outlet N3. The cold air (the airflow F3) flowing out from the first flow outlet N4 may directly blow toward the heat sources 11 and 12 in the body 110 and dissipate heat, and then blow out of the body 110 through the opening 111c of the body 110, and the cold air (the airflow F2) flowing out from the second flow outlet N3 blows toward the heat dissipating component 140 and dissipates heat, and then blows out of the body 110 through the opening 111b of the body 110. In other words, the fan 120 of the embodiment, particularly the centrifugal fan, axially takes in the air, and makes the spacing portions 122 and 123 respectively surround a place where the air axially enters and form independent spaces, so as to ensure that the air axially entering the fan 120 is the cold air of the external environment of the body 110, and is isolated from the spaces where the heat sources 11 and 12 and the heat dissipating component 140 are located with respect to the first flow outlet N4 and the second flow outlet N3, and can provide heat dissipation airflow paths that are unidirectional and non-conflicting with each other, and improve a heat dissipation capacity of the fan 120.

Figure 5:
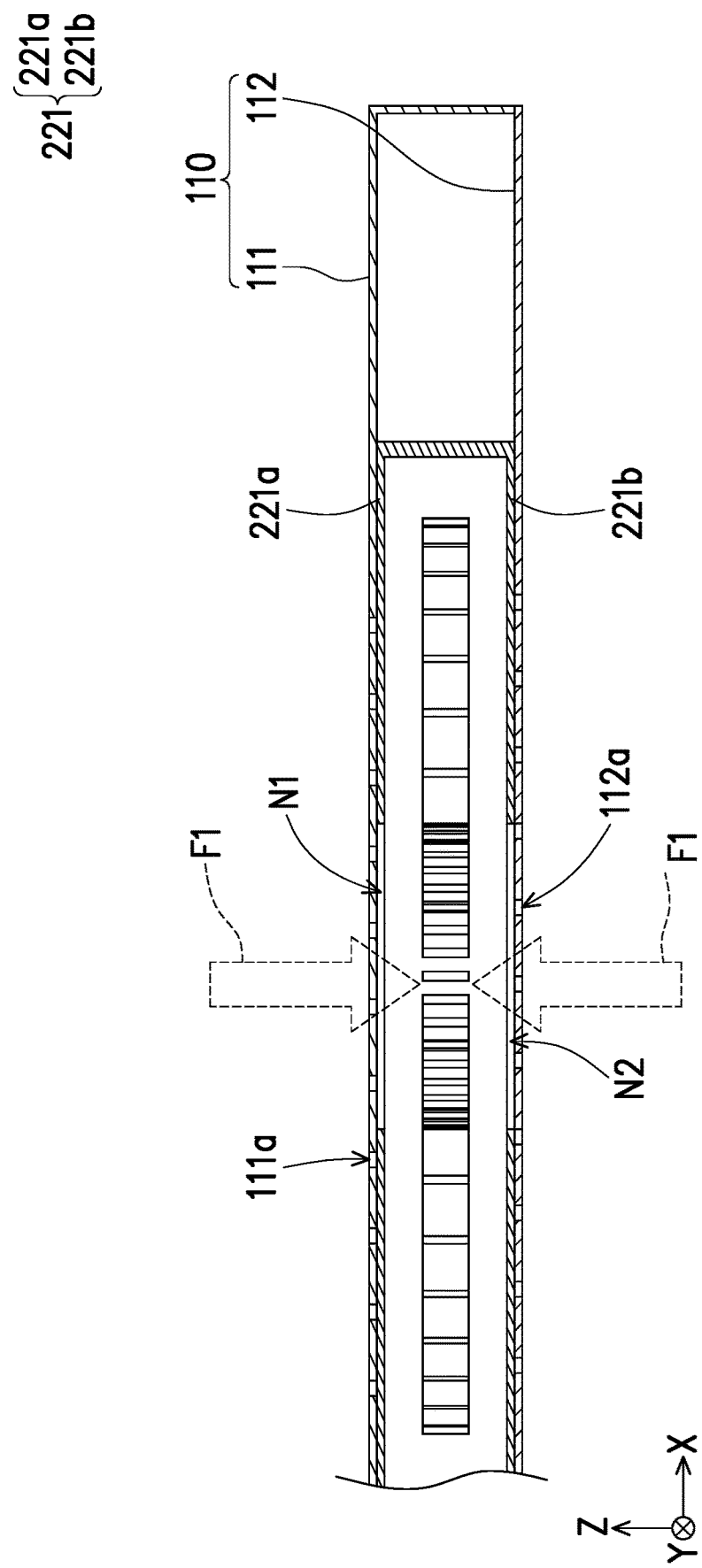
FIG. 5 is a partial cross-sectional view of a heat dissipation system according to another embodiment of the disclosure.

FIG. 5 is a partial cross-sectional view of a heat dissipation system according to another embodiment of the disclosure. Referring to FIG. 5, different from the spacing portions 122 and 123 that protrude from the fan body 121 of the fan 120 according to the above embodiment, in the embodiment as shown in FIG. 5, a spacing portion 221 is also the fan body. That is to say, in the embodiment, the spacing portion 221 and the fan body are regarded as an integrated structure, and are structurally abutted against the body 110 directly; as shown in FIG. 5, the spacing portion 221 includes an upper top board 221a and a lower top board 221b, which respectively abut against the upper casing 111 and the lower casing 112 of the body 110. In this way, the opening 111a at the upper casing 111 can be regarded as a same structure of the flow inlet N1, and the opening 112a at the lower casing 112 can be regarded as a same structure of the flow inlet N2.

Figure 6A:
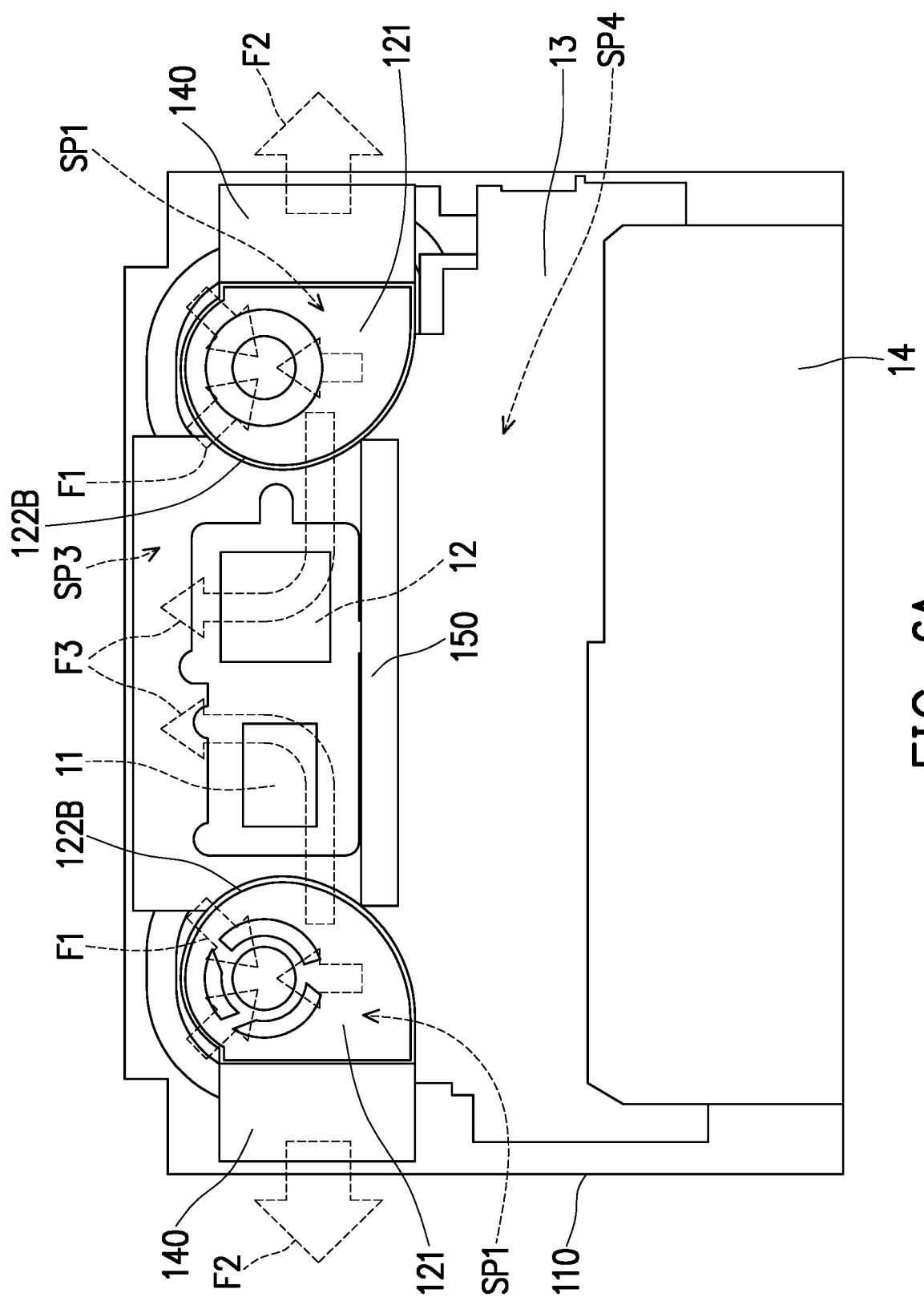
FIG. 6A and FIG. 6B are schematic views of a heat dissipation system in a portable electronic device shown from different visual angles.
Figure 6B:
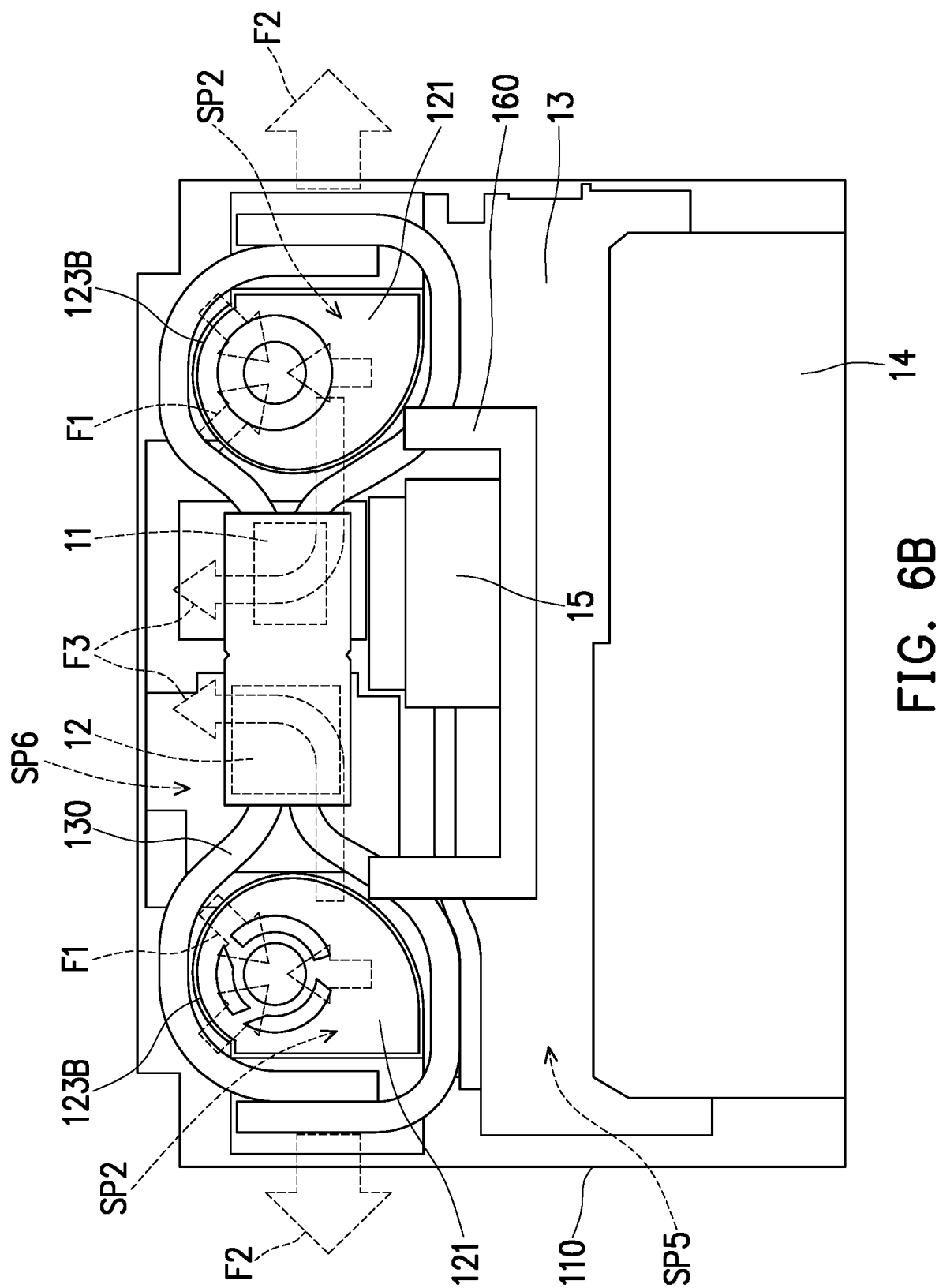

FIG. 6A and FIG. 6B are schematic views of a heat dissipation system in a portable electronic device shown from different visual angles, and the visual angles of the two are substantially opposite to each other. That is, FIG. 6A and FIG. 6B can be regarded as a top view and a bottom view of an inside of a main body of the notebook computer. Referring to FIG. 6A and FIG. 6B, in the embodiment, the heat dissipation system includes two fans, and the fan bodies 121 thereof are respectively located on two opposite sides of the heat sources 11 and 12. Similarly, each of the fans has two flow outlets, and generates the airflows F2 and F3 as shown in the figure; the airflow F2 serves to perform heat dissipation on the heat dissipating component 140, and the airflow F3 serves to perform heat dissipation on the heat sources 11 and 12; a related description thereof may be known from the above embodiment, and thus is not repeated here. That is, the embodiment further provides the two fans as heat dissipation parts. The flow outlets (equivalent to the first flow outlet N4 of the aforementioned embodiment) generating the airflow F3 face each other and all face toward the heat sources 11 and 12, and the flow outlets (equivalent to the second flow outlet N3 of the aforementioned embodiment) generating the airflow F2 face away from each other and all face toward an outside of the body 110, and through such a configuration, a better heat dissipation efficiency is provided.

It should also be mentioned that the embodiment, besides forming independent spaces SP1 and SP2 by surrounding the flow inlet with spacing portions 122B and 123B of the fans, further provides barriers 150 and 160 in the body 110, and the barriers 150 and 160 respectively abut between the spacing portions 122B and 123B of the fans, and define different spaces in the body 110 again. As shown in FIG. 6A, the barrier 150, the spacing portions 122B, and a part of the body 110 form a space SP3, and the heat sources 11 and 12 are located in the space SP3; moreover, as shown in FIG. 6B, the barrier 160, the spacing portions 123B, and a part of the body 110 form a space SP6, and the heat sources 11, 12, and 15 (e.g., a memory module) are located in the space SP6.

In the embodiment, the portable electronic device 10 further includes a circuit board 13 and a battery 14. The heat sources 11, 12, and 15 and the barriers 150 and 160 are respectively disposed on two opposite surfaces of the circuit board 13, and by using the barriers 150 and 160 described in the previous paragraph, the spaces SP3 and SP6 where the heat sources 11, 12 and 15 are located can be isolated from the spaces SP1 and SP2 where the flow inlets are located, or spaces SP4 and SP5 where other components (e.g., the battery 14) are located, so as to prevent the heat generated by the heat sources 11, 12 and 15 from affecting the fan or the other components in the body. In the embodiment, the barriers 150 and 160 serve as isolation structures between the heat sources 11, 12, and 15 and the battery 14, which can avoid a situation where the heat transfers from the spaces SP3 and SP6 to the spaces SP4 and SP5 and causes damage to the battery 14.

Figure 7A:
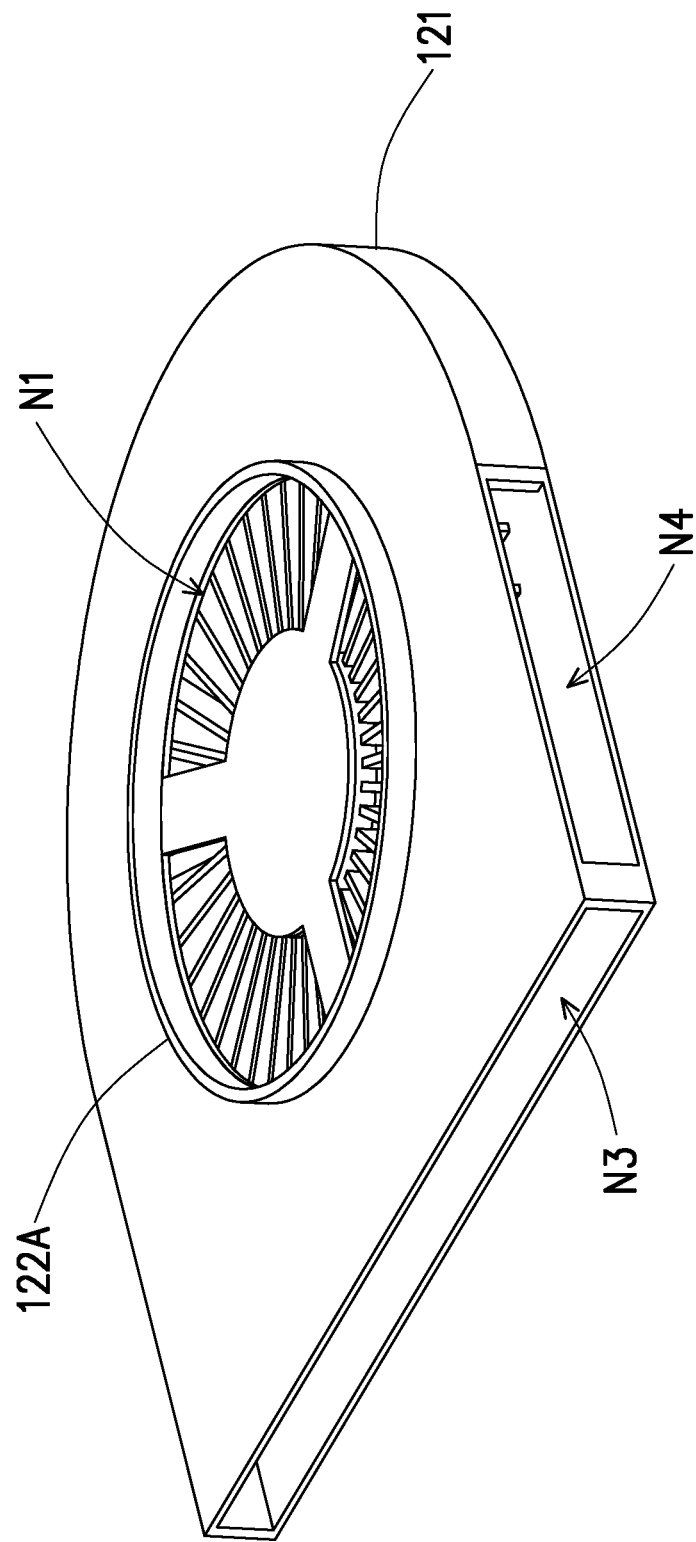
FIG. 7A and FIG. 7B are schematic views of a fan according to different embodiments of the disclosure.
Figure 7B:
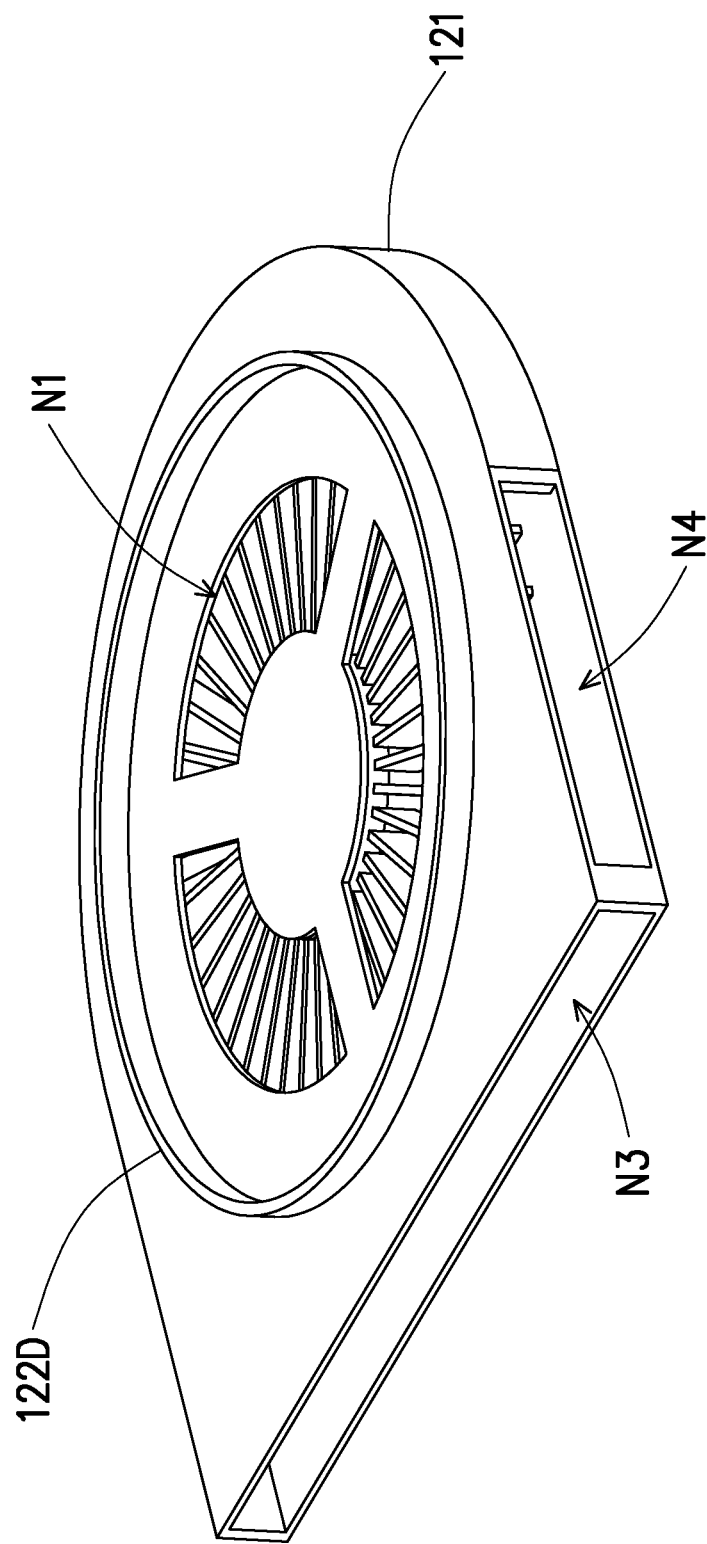

FIG. 7A and FIG. 7B are schematic views of a fan according to different embodiments of the disclosure. Referring to FIG. 7A first, different from the spacing portions 122 and 123 of the aforementioned embodiment, a spacing portion 122A of the embodiment is a buffer material, and is disposed on the fan body 121 along a periphery of the flow inlet N1 and forms a closed contour. Next, referring to FIG. 7B, in the embodiment, a spacing portion 122D is a buffer material, and forms a closed contour and is located between the flow inlet N1 and the periphery of the structure of the fan body 121. Whether the spacing portions 122 and 123 of the aforementioned embodiment or the spacing portions 122A and 122D described in the present paragraph can all achieve a state in which the flow inlet N1 and the flow outlets (e.g., the first flow outlet N4 and the second flow outlet N3) of the fan are isolated from each other, and avoid a situation where the heat dissipation airflows conflict with each other. Furthermore, the embodiment does not limit the number of flow inlets, and may provide only a single flow inlet on an impeller shaft of the fan body 121 according to a required heat dissipation condition. For example, taking FIG. 2 as an example for comparison, the aforementioned single flow inlet may be realized by leaving only the flow inlet N1 on the fan body 121, so that the body 110 only needs to reserve the corresponding opening 111a on the upper casing 111, and therefore the opening 112a may be removed from the lower casing 112. Since the opening 111a as shown in FIG. 1 may be shielded by a keyboard configuration of the notebook computer, the body 110 may have a beautiful back structure by removing the opening 112a, so that the portable electronic device 10 may achieve a better effect of visual appearance.

In summary of the above, since the heat dissipation system of the portable electronic device of the disclosure makes the spacing portion of the centrifugal fan surround the flow inlet of the fan and abut against the body, so as to isolate the flow inlet and the heat source in the body in the two spaces independent of each other, the flow inlet can ensure that the air sucked in only comes from the external environment of the body, and avoid a possibility that the heat generated by the heat source is sucked in by the fan again, so as to provide an improved approach to an existing heat accumulation situation generated by the heat dissipation path conflict in the body.

Furthermore, for the portable electronic device (the notebook computer), the configuration of the heat dissipation system is always a main factor affecting the performance of the electronic components (e.g., CPU and GPU). A flow field configuration disclosed in the above embodiments of the disclosure provides a corresponding airflow path design for the fan with dual flow outlets, so that the fan can generate forced convection to solve an overheating problem of the body, and thus further improves the performance of the electronic components, and reduces a manufacturing cost of the heat dissipation system.

That is to say, the above embodiments of the disclosure form the structure effectively isolating the flow inlet and the flow outlet of the fan by using the spacing portion of the fan, so a mutual interference and the situation where the heat dissipation air flow paths conflict with each other can be effectively avoided, and thus the effective heat dissipation part for the heat source is provided.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A heat dissipation system of a portable electronic device, comprising:
 a body, wherein at least one heat source of the portable electronic device is disposed in the body; and
 two fans, respectively being a centrifugal fan and disposed on two opposite sides of the heat source in the body, wherein each of the fans has at least one flow inlet, a first flow outlet and a second flow outlet, and at least one spacing portion, the first flow outlets face each other and all face toward the heat source, the second flow outlets face away from each other and all face toward an outside of the body, the spacing portion surrounds the flow inlet and abuts against the body, so as to isolate the flow inlet and the heat source in two spaces independent of each other in the body,
 wherein the heat dissipation system of the portable electronic device further comprises at least one barrier abutting between the spacing portions of the two fans, wherein the heat source is located in a space surrounded and formed by the barrier, the spacing portions, and a part of the body.

2. The heat dissipation system of the portable electronic device according to claim 1, wherein the body comprises an upper casing and a lower casing, and at least one of the upper casing and the lower casing comprises an opening corresponding to the flow inlet, and air of an external environment of the body flows into the fan through the opening and the flow inlet.

3. The heat dissipation system of the portable electronic device according to claim 1, wherein the body has at least one opening, and an airflow generated by the fan flows out from the flow outlet, and passes through the heat source and then flows out of the body from the opening.

4. The heat dissipation system of the portable electronic device according to claim 3, wherein the body has a plurality of openings, and the heat dissipation system of the portable electronic device further has a heat conducting component and a heat dissipating component, the heat conducting component is in thermal contact between the heat source and the heat dissipating component, so as to transfer heat generated by the heat source to the heat dissipating component, the fan comprises a first flow outlet and a second flow outlet, the airflow generated by the fan flows out from the first flow outlet and the second flow outlet, and the heat dissipating component is located between the second flow outlet and a part of the plurality of openings, wherein the airflow flowing out from the second flow outlet passes through the heat dissipating component and flows out of the body from the part of the plurality of openings, and the airflow flowing out from the first flow outlet passes through the heat source and then flows out of the body from another part of the plurality of openings.

5. The heat dissipation system of the portable electronic device according to claim 1, wherein the spacing portion is a buffer material disposed along a periphery of the flow inlet and forms a closed contour.

6. The heat dissipation system of the portable electronic device according to claim 1, wherein the spacing portion is a buffer material disposed along a periphery of a structure of the fan and forms a closed contour.

7. The heat dissipation system of the portable electronic device according to claim 1, wherein the spacing portion is a buffer material forming a closed contour and located between the flow inlet and a periphery of a structure of the fan.

8. The heat dissipation system of the portable electronic device according to claim 1, wherein the body comprises an upper casing and a lower casing, and the fan comprises two flow inlets and two spacing portions that are coaxially and correspondingly disposed, and the two spacing portions are buffer materials respectively abutting against the upper casing and the lower casing.

9. The heat dissipation system of the portable electronic device according to claim 1, wherein the spacing portion protrudes from a fan body of the fan.

10. The heat dissipation system of the portable electronic device according to claim 1, wherein the spacing portion is a fan body of the fan.

11. The heat dissipation system of the portable electronic device according to claim 1, wherein the portable electronic device further comprises a circuit board and a battery, the heat source and the barrier are disposed on the circuit board, and the heat source and the battery are isolated in two spaces independent of each other by the barrier.

\* \* \* \* \*